United States Patent
Pan et al.

[11] Patent Number: 6,099,699
[45] Date of Patent: Aug. 8, 2000

[54] THIN ENCAPSULATION PROCESS FOR MAKING THIN FILM READ/WRITE HEADS

[75] Inventors: Wei Pan, Lafayette, Colo.; Ann Kang, Pocatello, Id.; Jerome Marcelino, San Francisco, Calif.

[73] Assignee: Matsushita-Kotobuki Electronics Industries, Ltd., Ehime, Japan

[21] Appl. No.: 09/064,212

[22] Filed: Apr. 22, 1998

[51] Int. Cl.[7] .................................................. C23C 14/34
[52] U.S. Cl. ............................. 204/192.16; 204/192.2; 204/192.22; 204/192.23; 204/192.3; 204/192.15
[58] Field of Search ..................... 204/192.15, 192.16, 204/192.22, 192.2, 192.23, 192.3, 298.08, 298.03, 298.06

[56] References Cited

U.S. PATENT DOCUMENTS

| | | | |
|---|---|---|---|
| 4,036,723 | 7/1977 | Schwartz et al. | 204/192.15 |
| 4,418,473 | 12/1983 | Burkhart et al. | 204/192.15 |
| 4,875,987 | 10/1989 | Wada et al. | 204/192.15 |
| 5,062,937 | 11/1991 | Kumuro | 204/192.15 |
| 5,326,429 | 7/1994 | Cohen et al. | 156/655 |
| 5,485,334 | 1/1996 | Nix et al. | 360/113 |
| 5,532,892 | 7/1996 | Nix et al. | 360/113 |
| 5,573,809 | 11/1996 | Nix et al. | 427/123 |
| 5,608,593 | 3/1997 | Kim et al. | 360/113 |
| 5,634,260 | 6/1997 | Nix et al. | 29/603.14 |
| 5,637,235 | 6/1997 | Kim et al. | 216/22 |
| 5,639,509 | 6/1997 | Schemmel | 427/130 |
| 5,654,854 | 8/1997 | Mallary | 360/113 |
| 5,668,688 | 9/1997 | Dykes et al. | 360/113 |

*Primary Examiner*—Rodney McDonald
*Attorney, Agent, or Firm*—Robert G. Crouch; William J. Kubida; Hogan & Hartson LLP

[57] ABSTRACT

A process for providing a thin encapsulation layer for thin film heads includes controlling the bias voltage of the substrate and head during the encapsulation layer deposition process. The bias voltage is first maintained at approximately 60 volts while the standard encapsulation overcoat portion of the layer is deposited. This may take approximately one hour. Over the next thirty minutes, the bias voltage is ramped from approximately 60 volts to approximately 200 volts in a gradual, linear manner to reduce the stress on the wafer and heads. The bias voltage is then maintained at approximately 200 volts for the next three hours while the remainder of the encapsulation layer is deposited. Because of the higher bias voltage, the layer is deposited in a substantially planar manner so that there is no need for a lapping back process. Stress to the head is minimized by ramping the bias voltage. In addition, relatively short studs can be used for routing signals to and from the read/write elements of the head. The encapsulation layer is etched back in the vicinity of the studs with an NaOH/EDTA solution which produces via sidewalls with shallow angles, in the range of 20 degrees from horizontal.

12 Claims, 5 Drawing Sheets

THIN ENCAPSULATION PROCESS FOR MAKING THIN FILM READ/WRITE HEADS

The present invention relates to processes for making thin film recording heads for mass storage devices and in particular, the present invention relates to a process for encapsulating thin film recording heads with a thin alumina layer with improved topography and for improved etched vias to the studs for the bonding pads.

BACKGROUND OF THE INVENTION

Magnetic thin film heads for use in mass storage systems such as disk drives are known in the prior art. Many thin film heads include a single inductive element thereon which is used for writing data to the spinning magnetic disk and for reading data from the spinning magnetic disk. In the case of writing data, an electrical signal is applied to a conductor coil (the inductive element). A top pole and a bottom pole on either side of the conductor coil help to focus the magnetic field induced by the current flowing through the coil. The focused magnetic field is applied to the nearby moving magnetic medium. The magnetic field causes a magnetic signal representative of the electrical signal to be stored on the magnetic medium.

For reading data from the magnetic medium, the magnetic flux signal from the magnetic medium induces a magnetic flux signal between the top pole and bottom pole of the thin film head, which causes a magnetic flux signal to be applied to the conductor coil. This magnetic signal induces an electrical signal in the conductor coil which is representative of the magnetic signal recorded on the moving magnetic medium.

Since the read and write operations necessarily involve inducing signals in two opposite directions between a moving magnetic medium and a conductor coil, the single element inductive head is a compromised design which may be less than optimal for read operations and less then optimal for write operations.

The need for this compromise has been reduced in recent years with the development of thin film heads which employ magneto-resistive technology for the read function and a separate head employing standard inductive technology for the write function. In this manner, the separate heads can be optimized. The magneto-resistive (MR) element includes a nickel-iron (NiFe) film which changes its electrical resistance as a function of the strength of the magnetic field to which it is exposed. A constant current signal can be applied to the MR element and the varying voltage signal obtained from the MR element is representative of the magnetic signal stored on the moving magnetic medium. In order to prevent the NiFe film from being affected by any magnetic field other than the fields produced by the moving magnetic medium, the NiFe film is sandwiched between an upper and lower shield. The upper shield of this MR element can also function as the lower pole of the inductive element, giving rise to the name "merged MR heads."

As with any thin film head device, the manufacture and production of the devices is optimized to produce high yields with a minimum of production costs and time. Typically, merged MR heads are fabricated by building or stacking up a variety of materials in the form of films on a wafer. Processes for applying the materials in the form of films include sputtering, plating, and other forms of deposition. There are many layers deposited on the wafer including shield layers, gap layers, MR layers, coil layers, and pole layers. On top of the top pole layer, an overcoat of aluminum oxide ($Al_2O_3$) is sputtered. This $Al_2O_3$ encapsulating layer serves to protect all of the active layers underneath from being exposed to the air, so as to protect them. This $Al_2O_3$ layer adds typically 40 $\times 10^6$ meters (40 micrometers, microns, or $\mu m$.) to the stack, which may itself already be 15 microns thick. At appropriate positions on the thin film head, gold or copper metal studs are provided protruding upwardly from the stack and through the encapsulation layer. The encapsulation layer has to be so thick because of the existence of so many peaks and troughs due to the top pole and the studs. The upper surface of the encapsulation layer is inherently uneven and irregular, having sharp edges thereon. To eliminate these sharp edges prior to subsequent processes are applied to the head (such as cutting/dicing and slider processing) the encapsulation layer is then lapped back and polished with a slurry of alumina in base solution. This is a time-consuming and dirty process. The encapsulation layer deposition process may take as long as fourteen hours and much of the material deposited is subsequently wasted when the lapping back process is performed. Metal studs are then opened after lapping for attachment of bonding pads and conductors thereto to allow the electrical signals to be routed to and from the active elements of the thin film head. These gold or copper metal studs may be as tall as 35 microns, much of which is eliminated in the lapping back process. In addition, to create such tall studs, uniform columns of photoresist material must be applied, which is difficult in the photo process.

As can be appreciated, the processes of depositing the thick encapsulation layer and lapping back to expose the metal studs are time consuming, costly, and dirty. In particular, it may take as long as fourteen hours to deposit the encapsulation layer. This is the longest process of all of the individual processes utilized in fabricating the thin film head. In addition, the gold metal studs are costly and a significant portion of them is wasted in the lap back process. Also, the process of lapping back the layer produces excess material and can cause contamination, reducing the yields for production of the thin film heads.

U.S. Pat. No. 5,326,429 discloses a method for manufacturing thin film heads wherein studs are eliminated from the design by depositing the coils and bonding pads simultaneously. Vias are later etched through the alumina overcoat layer to expose the bonding pads. A liquid etchant of hydrofluoric (HF) acid in water is used to create the vias. Unfortunately, HF acid is a hazardous liquid that is undesirable to use in production. Also, a street and alley pattern of scribe-line grooves is etched across the wafer for sawing and machining the wafer into individual heads, or sliders. These grooves eliminate most alumina chipping due to stress and damage introduced by the sawing and machining operations.

It is known in the industry that manufacturing yields can be minimized in part by minimizing the stress on the wafers and the sliders. While there are many techniques used to reduce the stress, one relevant to the present invention is using a low bias voltage level on the wafer during the encapsulation layer deposition process. It has been generally believed that higher bias voltages would increase the stress and decrease the yield of usable products from the manufacturing process.

It is against this background, and the desire to solve the problems of and improve on the prior art, that the above invention has been developed.

SUMMARY OF THE INVENTION

The present invention is directed to a process for encapsulating a thin film recording head. The process includes the steps of providing a substrate with a fabricated stack of recording head components ready for the encapsulation layer and providing a sputtering system for depositing the encapsulation layer, the sputtering system including a chamber in which the process is conducted and a target within the chamber from which the material to be deposited will be sputtered. The process also includes the steps of biasing the target to a first voltage relative to the chamber and biasing the substrate to a second voltage relative to the chamber. In addition, the process includes the steps of beginning to deposit the material onto the fabricated stack, to a depth sufficient to cover the components of the fabricated stack and increasing the second relative bias voltage between the substrate and the chamber over time while continuing to deposit the material onto the fabricated stack.

The process may further include the additional step after the increasing step of maintaining a substantially constant relative bias voltage between the substrate and the chamber while continuing to deposit the material onto the fabricated stack. The increasing step may include increasing the relative bias voltage between the substrate and the chamber to greater than a 150 volt difference. The relative bias voltage may be increased to approximately 200 volts. The constant relative bias voltage may be approximately 200 volts. The second voltage may be approximately 60 volts. The time period may be approximately one hour. The increasing step may be performed for approximately 0.5 hours. The maintaining step may be performed for approximately 3 hours. The total of the beginning, increasing, and maintaining steps is approximately 4.5 hours.

The present invention is also directed to a process for creating bond pads on a thin film recording head. The process includes the steps of providing a fabricated stack of recording head components including a relatively thin encapsulation layer and etching through the encapsulation layer to form encapsulation side walls having an angle of less than 60 degrees from the horizontal The process also includes the step of plating a metallic bond pad between the encapsulation side walls.

The angle may be approximately 20 degrees. The etching may be performed with an NaOH/EDTA etching solution. The etching step may also include the steps of applying photoresist to the areas adjacent the area to be etched, applying an NaOH/EDTA etching solution to the area to be etched, and removing the photoresist.

The present invention is also directed to a process for encapsulating a thin film recording head. The process includes the steps of providing a substrate with a fabricated stack of recording head components ready for the encapsulation layer and providing a sputtering system for depositing the encapsulation layer, the sputtering system including a chamber in which the process is conducted and a target within the chamber from which the material to be deposited will be sputtered. The process also includes the steps of biasing the target to a first voltage relative to the chamber and biasing the substrate to a second voltage relative to the chamber, the second voltage being less than approximately 125 volts in magnitude. In addition, the process also includes the steps of beginning to deposit the material onto the fabricated stack, to a depth sufficient to cover the components of the fabricated stack and increasing the second relative bias voltage between the substrate and the chamber gradually over time to a third bias voltage while continuing to deposit the material onto the fabricated stack, the third bias voltage being greater than approximately 150 volts in magnitude, wherein this increasing step occurs over a time period greater than approximately five minutes. Also, the process includes the step of maintaining the substrate bias voltage at approximately the third voltage while continuing to deposit the material onto the fabricated stack.

BRIEF DESCRIPTION OF THE DRAWINGS

The accompanying drawings, which are incorporated in and form a part of the specification, illustrate the preferred embodiments of the present invention, and together with the descriptions serve to explain the principles of the invention.

In the Drawings.

DETAILED DESCRIPTION OF THE PREFERRED EMBODIMENTS

Figure 1:
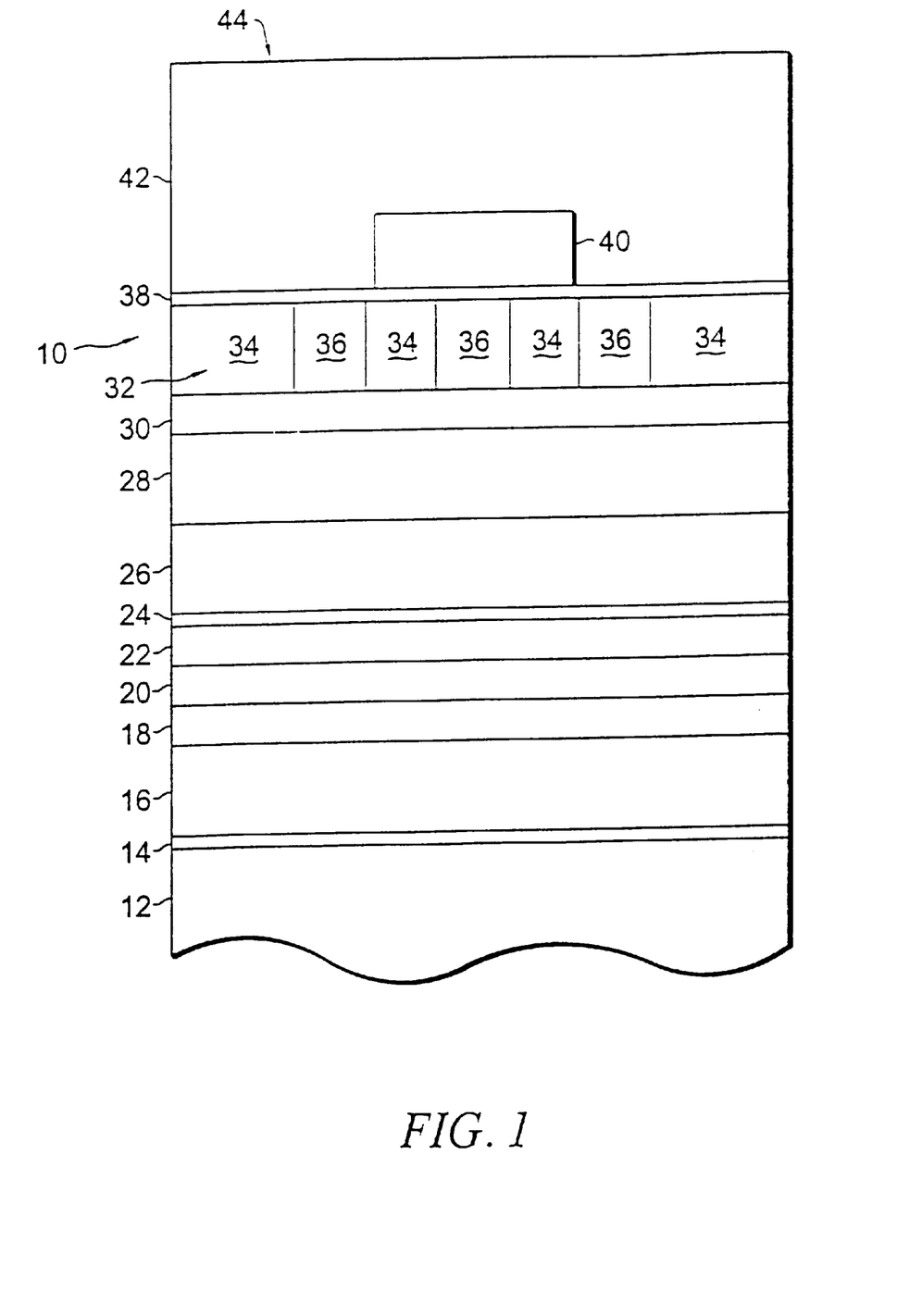
FIG. 1 is a cross-sectional view of a portion of a thin film head of the present invention.

A thin film head 10 of the present invention, as shown in FIG. 1, is created through sequential application of layers, including an encapsulation layer. The encapsulation layer is also etched to create vias through which studs are exposed. A bonding pad is attached in each of the vias to the corresponding stud.

The thin film head 10 includes a wafer composed of aluminum titanium-carbon (AlTiC). The wafer 12 may be in the range of 1.2 millimeters (mm) thick. On top of the AlTiC wafer 12, a metal seed layer 14 for the bottom shield is sputtered. The seed layer 14 is preferably composed of nickel-iron (NiFe). On top of the seed layer 14, a bottom shield 16 is plated. The bottom shield may be composed of 80/20 NiFe and may be approximately 3 $\mu$m in thickness.

On top of the bottom shield 16, a first read gap layer 18 is sputtered. The read gap layer may be composed of aluminum oxide ($Al_2O_3$) and other dielectric compounds. The read gap layer may have a thickness within the range of 500 to 1500 Angstroms ($A_0$), which is 0.05 to 0.15 $\mu$m. Preferably, the thickness of the first read gap layer 18 may be 750 $A_0$. On top of the first read gap layer 18 is the MR (magneto-resistive) structural layer 20. The MR structural layer includes five sub-layers therein, a tantalum layer, a soft adjacent layer (SAL), another tantalum layer, a layer of NiFe (the magneto-resistive element), and a last tantalum layer. The soft adjacent layer may be composed of an 80/19/1 mixture of nickel-iron-molybdenum (NiFeMo). Each of the five sub-layers may have a thickness of 50 to 100 $A_0$, for a total thickness for the MR structural layer 20 of 250 to 1000 $A_0$.

On top of the MR structural layer 20, a second read gap layer 22 is provided. The second read gap layer 22 may preferably have a thickness of 750 $A_0$ like the first read gap layer 18. On top of the second read gap layer 22, a shared-shield (SS) seed layer 24 is sputtered. The shared-shield seed layer 24 acts as both an upper shield for the MR (read) element in the MR structural layer 20 and as a bottom pole for the inductive (write) element. On top of the shared-shield seed layer 24, the shared-shield layer 26 is provided. The shared-shield layer 26, like the bottom shield layer 16, is preferably plated out of an 80/20 composition of NiFe to a thickness of 3 µm. On top of the shared-shield layer 26 is a write gap layer 28 composed of $Al_2O_3$.

The write gap layer may preferably be 3000 $A_0$ thick. On top of the write gap layer 28, a seed layer 30 of Cr/Cu is provided. This layer 30 may preferably have a thickness in the range of 700 $A_0$, 200 $A_0$ for the Cr and 500 $A_0$ for the Cu. On top of the CR/CU seed layer 30, a coil layer 32 is provided. The coil layer 32 includes spaced-apart regions of photoresist material 34, used as insulation between several spaced-apart regions of copper coil material 36. The coil layer 32 may be 3 µm in thickness. On top of the coil layer 32 a top pole seed layer 38 is provided. On top of the top pole seed layer 38 is a top pole layer 40. The top pole may be composed of NiFe and may not be as wide as the remainder of the layers, in order to meet the requirements of narrow write tracks. The top pole layer 40 may be 4.0 µm. in thickness. On top of the top pole layer 40, an overcoat or encapsulation layer 42 composed of aluminum oxide ($Al_2O_3$) is sputtered.

The encapsulation layer 42 is produced in a manner very different than the prior art. Prior art encapsulation layers have typically been deposited in a thickness in the range of 40 µm. This thick layer was required in the prior art because of the irregular manner in which the layer was deposited onto the head. Sharp edges on the upper surface were typical. In addition, the top pole layer is not uniform in the first place. The top pole covers only a portion of the layer there beneath. In addition, there are studs at this level in the head 10 which carry electrical signals to and from the read and write elements in the head. In order to obtain a smooth and regular upper surface for the prior art encapsulation layer, an excess amount of encapsulation material was deposited, and then a significant amount of the material was lapped back (through a grinding process with slurry alumina powder in solution) to produce the smooth, regular surface. In the present invention, the encapsulation layer 42 is produced in a manner which inherently develops a smooth, regular top surface 44.

Figure 2:
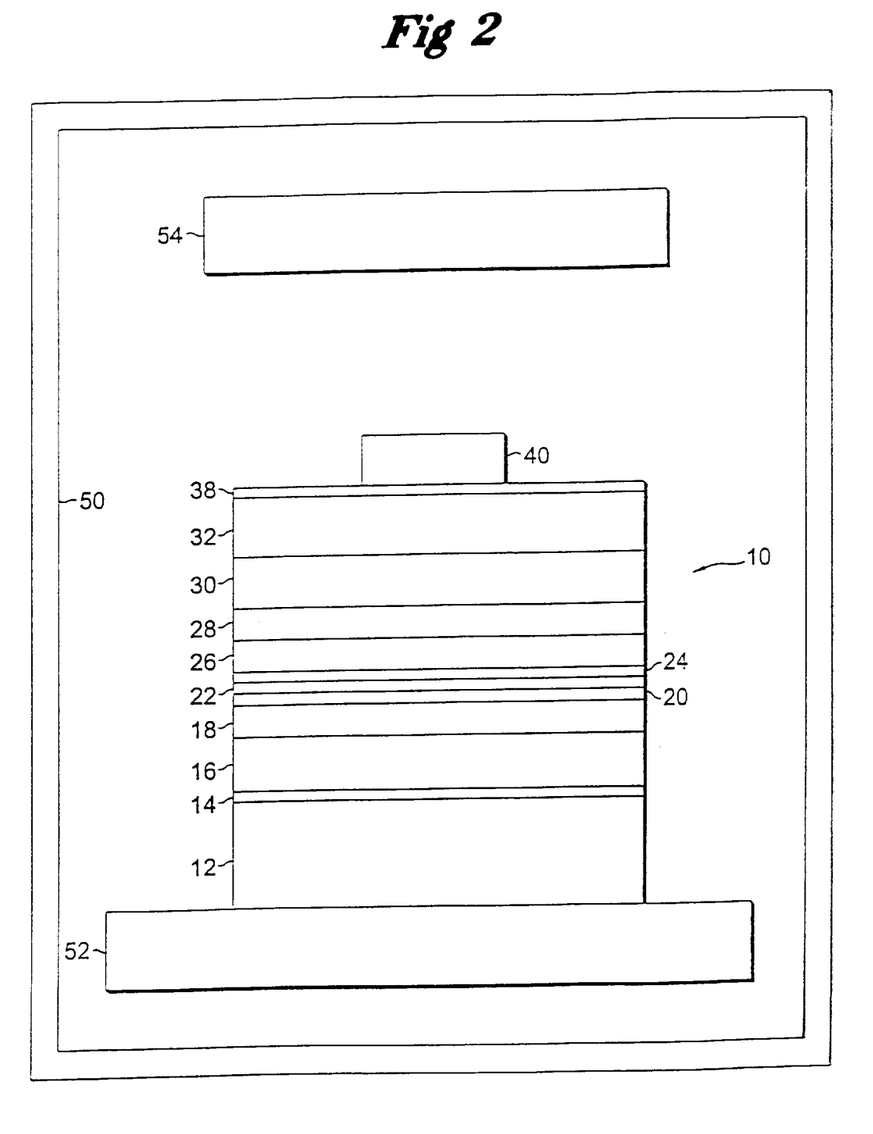
FIG. 2 is a front view of the thin film head of FIG. 1 in a deposition chamber, showing the alumina encapsulation layer being applied.

The encapsulation layer 42 is deposited on the head 10 by a sputtering process, shown in FIG. 2. The sputtering process is conducted in an industry standard alumina deposition chamber such as Model No. 2460 from Alcatel Comptech, of Fremont, Calif. As can be seen, the chamber 50 includes a substrate 52 onto which the head 10 being manufactured is placed. A target 54 is placed above the head 10 on the substrate 52. The substrate 52 and the target 54 are each separately biased to a different electrical voltage relative to the chamber 50. The bias voltage applied to the substrate 52 during the deposition process is graphically shown in FIG. 3. As can be seen from FIG. 3, the bias voltage is held at a constant 60 volts relative to the chamber 50 for the first one hour of deposition. During this time, the bias power to the target is ramped up in steps from 4 kilowatts to 6 kilowatts to 8 kilowatts to 10 kilowatts. Ramping the power to the target 54 in this manner provides an industry standard overcoat to the top of the head 10 in a thickness of 2 to 3 µm.

Figure 3:
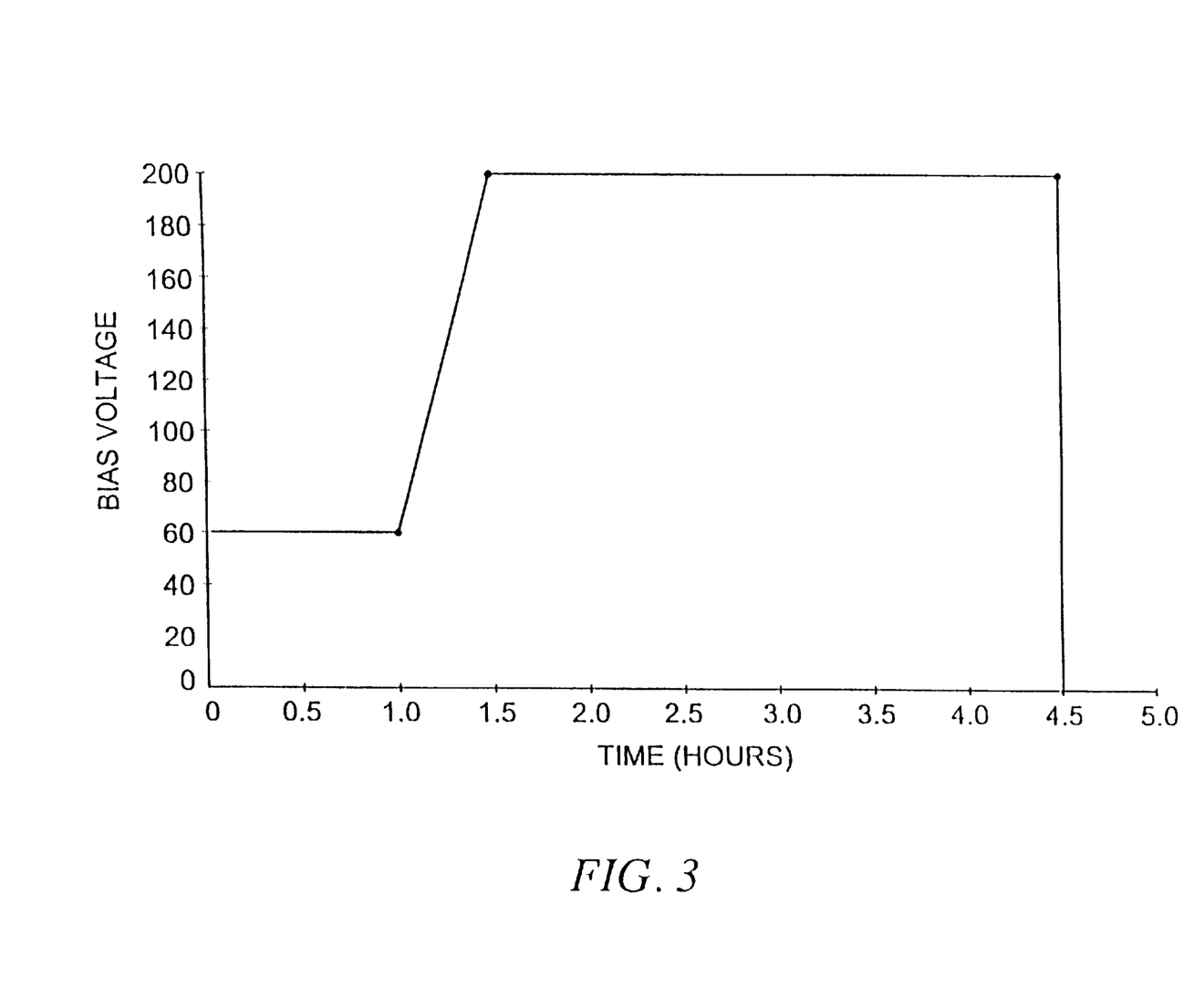
FIG. 3 is a graphical representation of the bias voltage applied to the thin film head of FIG. 1 versus time, during the alumina encapsulation layer application process.

After the industry standard overcoat has been applied by ramping the power to the target 54 in the described manner, the voltage to the substrate 52 is ramped from 60 volts to 200 volts over the next one-half hour, as shown in FIG. 3. The bias voltage to the substrate 52 is then held constant at 200 volts for the next three hours to finish the encapsulation layer. It has been discovered that this higher bias voltage to the substrate 52 results in a smoother, more regular surface than with lower bias voltages. It could very well be that even higher bias voltages than 200 volts would produce even smoother surfaces, or possibly produce smooth surfaces in a shorter time period. Such modifications would be deemed to be within the spirit of this invention. The bias voltage described in this embodiment is limited to 200 volts by the operating parameters of the Alcatel system described above. In addition, the slope of the ramp in the bias voltage to the target, shown in FIG. 3, could be different and still be within the spirit of this invention. Through experimentation, this particular slope has been discovered to produce satisfactory results. The slope was selected as a compromise between minimizing the entire elapsed time depositing the encapsulation layer, and minimizing the stress (compressive and tensile) placed on the head 10. Instantaneously changing the voltage from 60 volts to 200 volts would greatly increase the stress on the head 10. In order to maintain high yields in the production of such heads 10, it is desirable to minimize the stress, and it has been discovered that increasing the voltage in this manner, or in any other suitable manner, produces a minimum of stress.

Figure 4:
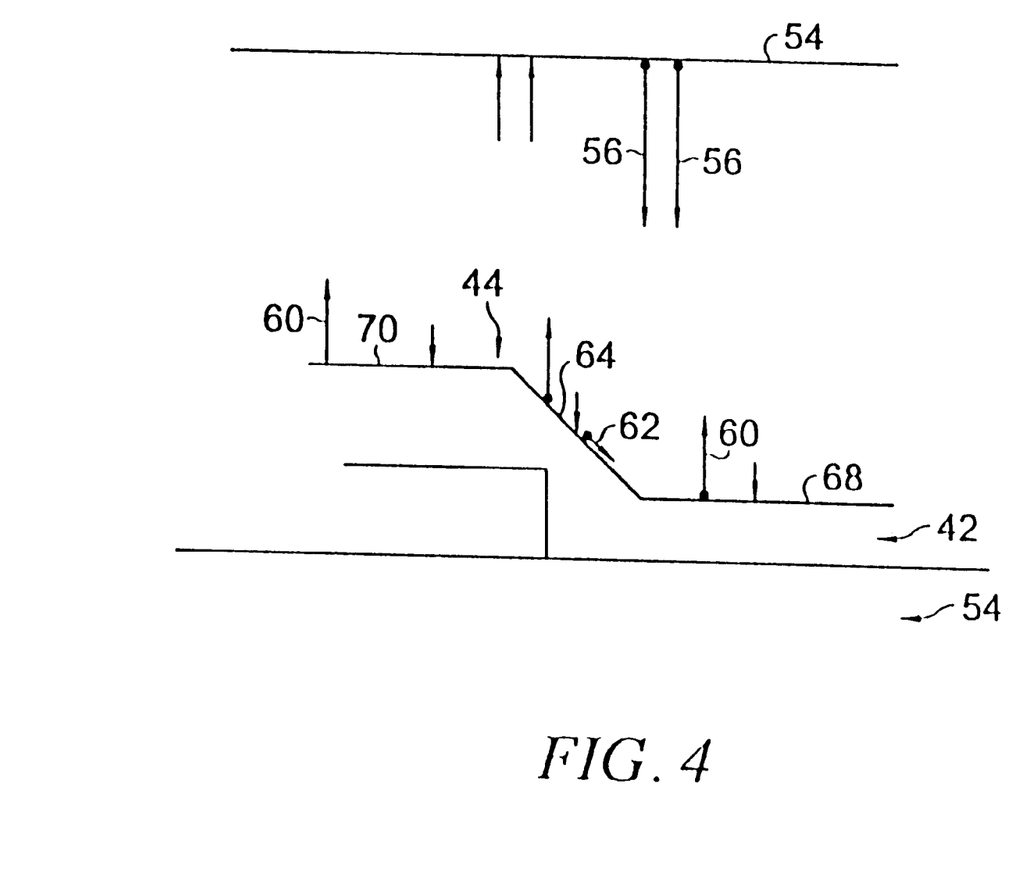
FIG. 4 is a close-up schematic representation of the energy applied and alumina sputtered during the alumina encapsulation layer application process shown in FIG. 2.

It is believed that the higher bias voltages produce a smoother surface than lower bias voltages because of the combination of the following factors. The increased bias voltage to the substrate 52, increases the amount of alumina material which will be sputtered off of the top of the encapsulation layer 42 of the head 10. Surfaces normal to the direction of energy flow (parallel to the target) will sputter less alumina material therefrom than sloped surfaces. As seen in FIG. 4, there is current drawn to each of the target 54 and the head 10 on the substrate 52. The current flows in the form of an argon plasma. The strength of the current is related to the bias power applied to the substrate 52 and to the target 54. As a result of the argon plasma striking the alumina on the target 54 and the head 10 on the substrate 52, a certain amount of alumina is sputtered off of those surfaces. The amount sputtered is related to the magnitude of the current striking those surfaces.

As can be seen better in FIG. 4, alumina is sputtered off of the target 54 as indicated by the arrows 56. In addition, alumina is sputtered off of the top surface 44 of the head 10 on the substrate 52 as represented by the arrows 60 and 62. The arrows 60 represent the alumina sputtered from an upper surface 70 and a lower surface or trough 68 in a direction toward the target 54. The arrow 62 represents the alumina sputtered parallel to and along a sloped surface 64 toward the trough 68. In this manner, the trough 68 is built up faster than the upper surface 70 and the sloped surface 64, so that the trough 68 will rise to coincide with the upper surface 70 (or nearly thereto) and eliminate the sloped surface 64. In this manner, the smooth, regular surface is created by the technique of the present invention. The magnitude of the amount sputtered off of the top surface 44 of the head 10 on the substrate 52 is a function of the current striking the surface 44, and thus of the bias voltage. In other words, by increasing the bias voltage to the substrate 52, the sputtering indicated by the arrows 60 and 62 is increased and the effect described above of building up the trough 68 faster than the upper surface 70 is enhanced.

Figure 5A:
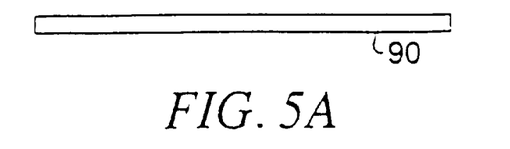
FIG. 5a through 5f are sequential cross-sections of the encapsulation of a stud, etching a via in the encapsulation layer, and applying a bonding pad in the via to the stud, all processes of the present invention.
Figure 5B:
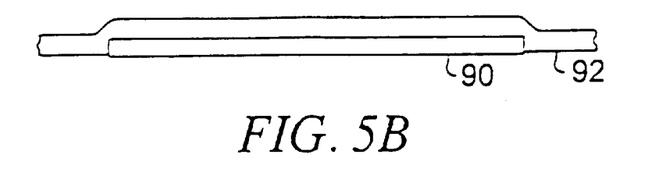
Figure 5C:
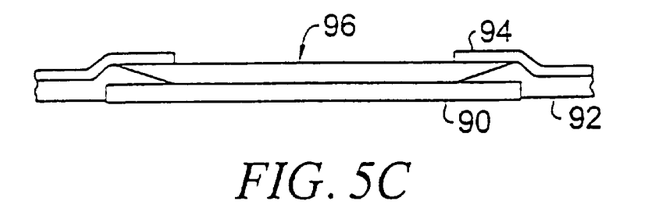
Figure 5D:
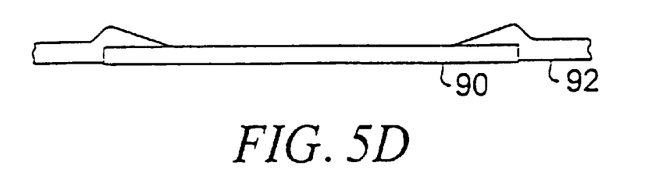
Figure 5E:
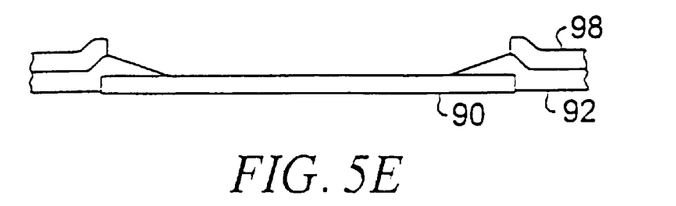
Figure 5F:
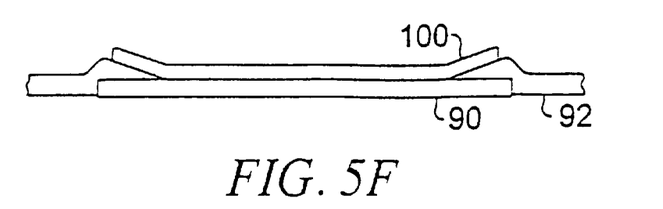

In order to provide bonding surfaces for the studs attached to the coils and the coil layer 32 and the MR element in the MR structural layer 20, an etching process as shown in FIGS. 5a through 5f is used. A stud 90 is shown in FIG. 5a. The stud 90 may be 5 to 10 µm. in thickness. By using studs of this height, as opposed to the 35 µm. studs of the prior art, the process of creating the stud is greatly simplified. A 10 micron encapsulation layer overcoat 92 is applied, as shown in FIG. 5b, preferably with the process described above. An overcoat of a layer of photoresist material 94 is applied on top of the overcoat layer 92 with a gap in the photoresist material 94 centered over the stud 90, as shown in FIG. 5c. Into the gap is placed a liquid mixture 96 of sodium hydroxide (NaOH) and ethylenedinitrilotetraacetic acid (EDTA). The EDTA may be at a strength of 50 grams per liter (g/l) and the NaOH may be at a strength of 10 g/l. The liquid mixture 96 acts as an alumina etchant to etch away a portion of the encapsulation layer 92 to expose the stud 90. When this NaOH/EDTA etchant has a pH between 8.7 and 11.6 and the temperature of the etchant is between 60 and 70 degrees C., the etchant may have an etch rate of between 100 and 4,000 $A_0$ per minute. After the stud 90 has been exposed, the photoresist material 94 can be removed, as shown in FIG. 5d. A metal seed layer (not shown) is deposited for plating a bond pad and another layer of photoresist material 98 is then applied on top thereof with a gap in the photoresist material 98 centered over the stud 90, as shown in FIG. 5e. In this gap in the photoresist material 98, a gold bonding pad 100 is plated and the photoresist material 98 removed, as shown in FIG. 5f.

It has been discovered that the use of the NaOH/EDTA etchant in place of hydroflouric acid (HF) as an etchant (as is common in the prior art) provides the following advantages. First of all, the NaOH/EDTA solution is much less hazardous than the HF solution. Perhaps more importantly the NaOH/EDTA solution has an inherently slower etch rate than HF. This has the added benefit of producing an etched via with very shallow, rather than steep, walls. As can be seen in FIGS. 5c through 5f, the side walls of the vias may be only ten to thirty degrees from horizontal, which is far from the nearly ninety-degree side walls of the prior art. Preferably this angle from horizontal may be twenty degrees. It has been discovered that the shallower angles of the side walls in the present invention are preferable because the tendency for contaminants and debris to collect in the vias is decreased as compared with steeper side walls.

The foregoing description is considered as illustrative only of the principles of the invention. Furthermore, since numerous modifications and changes will readily occur to those skilled in the art, it is not desired to limit the invention to the exact construction and process shown as described above. Accordingly, all suitable modifications and equivalents may be resorted to falling within the scope of the invention as defined by the claims which follow.

The invention claimed is:

1. An overcoat deposition process for encapsulating a thin film magnetic head with a protective layer of an encapsulation material using a continuous sputtering process comprising the steps of:

providing a substrate having a stack of head components that are ready to receive the protective layer;

providing a sputtering system for depositing the protective layer from a target that contains the encapsulation material;

the sputtering system including a chamber in which the sputtering process is conducted, the substrate being within the chamber and the target being within the chamber;

biasing the target to a target bias voltage value relative to the chamber;

biasing the substrate to a first substrate bias voltage value relative to the chamber, the first substrate bias voltage value being different than the target bias voltage value;

beginning to deposit the protective layer onto the head components from the target while maintaining the first substrate bias voltage value substantially constant, and for a first time interval to produce a first depth of the encapsulation material that is sufficient to cover the fabricated stack;

gradually increasing bias power that is applied to the target during the first time interval;

thereafter gradually increasing the substrate bias voltage value from the first value to a higher value over a second time interval while continuing to deposit a second depth of the encapsulation material onto the first depth of the encapsulation material;

thereafter maintaining the higher substrate bias voltage value substantially constant for a third time interval while continuing to deposit a third depth of the encapsulation material onto the second depth of encapsulation material; and stopping the sputtering process when a total depth of the first, second and third depths of encapsulation material equals a desired depth.

2. The process defined in claim 1 wherein the step of gradually increasing the substrate bias voltage comprises gradually increasing the substrate bias voltage value from a value that is less than about a 125 volt difference between the substrate and the chamber to a value that is in a range of about 150 volt to about 200 volt difference between the substrate and the chamber.

3. The process defined in claim 1 wherein the step of gradually increasing the substrate bias voltage comprises gradually increasing the substrate bias voltage value from a value that is about a 60 volt difference between the substrate and the chamber to a value that is in the range of about 150 volt to about 200 volt difference between the substrate and the chamber.

4. The process defined in claim 1 wherein the first time interval is between 25 and 95 minutes.

5. The process defined in claim 4 wherein the second time interval is at least 20 minutes.

6. The process defined in claim 5 wherein the third time interval is at least 60 minutes.

7. The process defined in claim 6 wherein the total of the first, second and third time intervals is less than 10 hours.

8. The process defined in claim 1 wherein the first time interval is about one hour.

9. The process defined in claim 8 wherein the second time interval is about 30 minutes.

10. The process defined in claim 9 wherein the third time interval is about 3 hours.

11. The process defined in claim 10 wherein the total of the first, second and third time intervals is substantially 4.5 hours.

12. A method of encapsulating a thin film magnetic head with a protective encapsulation layer using one continuous sputtering process comprising the steps of:

providing a substrate having head components that are ready to receive the encapsulation layer;

providing a sputtering system for depositing the encapsulation layer from a target that contains an encapsulation material;

the sputtering system including a chamber in which the sputtering process is conducted, the target being within the chamber and the substrate being within the chamber;

biasing the target to a target bias voltage value relative to the chamber and applying biasing power to the target;

biasing the substrate to a first substrate bias voltage value relative to the chamber;

the first substrate bias voltage value being different than the target bias voltage value, and the first substrate bias voltage value being less than about 125 volts;

beginning to deposit encapsulation material from the target onto the head components while maintaining the first substrate bias voltage substantially constant;

continuing the beginning deposit and increasing the biasing power to the target for a first time period that is sufficient to produce a depth of a first encapsulation layer that completely covers the head components;

thereafter gradually increasing the first substrate bias voltage value to a second and higher substrate bias voltage value during a second time period while depositing a second encapsulation layer onto the first encapsulation layer, the second higher substrate bias voltage value being greater than about 150 volts, and the second time interval being greater than about five minutes;

thereafter maintaining the substrate bias voltage value substantially constant at about the second higher value while depositing a third encapsulation layer onto the second encapsulation layer; and terminating the sputtering process when a total thickness of the first, second and third encapsulation layers equals a predetermined thickness.

* * * * *